(12) United States Patent
Hamada et al.

(10) Patent No.: US 11,490,549 B2
(45) Date of Patent: Nov. 1, 2022

(54) HIGH-FREQUENCY MODULE

(71) Applicant: Nippon Telegraph and Telephone Corporation, Tokyo (JP)

(72) Inventors: Hiroshi Hamada, Tokyo (JP); Hideyuki Nosaka, Tokyo (JP)

(73) Assignee: NIPPON TELEGRAPH AND TELEPHONE CORPORATION, Tokyo (JP)

(*) Notice: Subject to any disclaimer, the term of this patent is extended or adjusted under 35 U.S.C. 154(b) by 116 days.

(21) Appl. No.: 16/979,103

(22) PCT Filed: Mar. 8, 2019

(86) PCT No.: PCT/JP2019/009297
§ 371 (c)(1),
(2) Date: Sep. 8, 2020

(87) PCT Pub. No.: WO2019/188113
PCT Pub. Date: Oct. 3, 2019

(65) Prior Publication Data
US 2020/0404816 A1 Dec. 24, 2020

(30) Foreign Application Priority Data
Mar. 30, 2018 (JP) .............................. JP2018-066837

(51) Int. Cl.
*H05K 9/00* (2006.01)
*H01P 3/08* (2006.01)
(Continued)

(52) U.S. Cl.
CPC ........... *H05K 9/0049* (2013.01); *H01P 3/081* (2013.01); *H04B 10/80* (2013.01); *H05K 1/0237* (2013.01);
(Continued)

(58) Field of Classification Search
CPC .... H05K 1/0237; H05K 1/025; H05K 1/0234; H05K 7/04; H05K 7/1427; H05K 9/0007;
(Continued)

(56) References Cited

U.S. PATENT DOCUMENTS 3,638,148 A * 1/1972 Hallford ................. H01P 5/107
333/33
4,259,684 A * 3/1981 Dean ..................... H01L 23/057
257/664
(Continued)

FOREIGN PATENT DOCUMENTS

JP S6063948 5/1985
JP S6063948 U * 5/1985
(Continued)

OTHER PUBLICATIONS

JP-S6063948-U (Translation) (Year: 2022).*
(Continued)

*Primary Examiner* — Hoa C Nguyen
*Assistant Examiner* — John B Freal
(74) *Attorney, Agent, or Firm* — Slater Matsil, LLP

(57) ABSTRACT

A high-frequency module includes: a chassis which is made of a conductor and which has an internal space; a high-frequency circuit board which is housed in the internal space of the chassis; and a resistive element provided between an inner wall that opposes the high-frequency circuit board among inner walls of the chassis which define the internal space and the high-frequency circuit board.

8 Claims, 9 Drawing Sheets

(51) Int. Cl.
*H04B 10/80* (2013.01)
*H05K 1/02* (2006.01)
*H05K 7/14* (2006.01)

(52) U.S. Cl.
CPC . *H05K 7/1427* (2013.01); *H05K 2201/10363* (2013.01)

(58) Field of Classification Search
CPC ....... H05K 9/0049; H05K 2201/09985; H05K 2201/10189; H05K 2201/10356; H01P 3/081; H01P 3/003; H01L 23/12
See application file for complete search history.

(56) References Cited

U.S. PATENT DOCUMENTS

| | | | | |
|---|---|---|---|---|
| 5,214,498 A | * | 5/1993 | Lehman | .................. H01L 23/66 257/701 |
| 6,337,661 B1 | * | 1/2002 | Kondoh | .................... H01P 1/16 257/E23.114 |

FOREIGN PATENT DOCUMENTS

| | | |
|---|---|---|
| JP | 2003298004 | 10/2003 |
| JP | 2017139561 | 8/2017 |

OTHER PUBLICATIONS

Hamada, Hiroshi, et al., "300-GHz Band 20-Gbps ASK Transmitter Modulebased on InP-HEMT MMICs," NTT Device Technology Labs, Oct. 11, 2015, Japan, pp. 1-4.

* cited by examiner

HIGH-FREQUENCY MODULE

CROSS-REFERENCE TO RELATED APPLICATIONS

This application is a national phase entry of PCT Application No. PCT/JP2019/009297, filed on Mar. 8, 2019, which claims priority to Japanese Application No. 2018-066837, filed on Mar. 30, 2018, which applications are hereby incorporated herein by reference.

TECHNICAL FIELD

The present invention relates to modular technology for handing high-frequency electric signals and, particular, to a high-frequency module in which a high-frequency circuit board is housed in an internal space of a chassis made of a conductor.

High-frequency circuits such as a high-speed optical communication electronic circuit and a millimeter-wave band radio communication electronic circuit are normally used in a state where the high-frequency circuit is mounted to a metallic chassis. In this case, substrate resonance becomes a problem. Substrate resonance refers to a phenomenon in which electromagnetic waves propagating inside a high-frequency circuit leak into a substrate made of a semiconductor or a dielectric on which the high-frequency circuit is formed, the leaked electromagnetic waves propagate inside the substrate, cause resonance at a specific frequency determined by a thickness and a length of the substrate, a size of the chassis, and the like, and impair intrinsic characteristics of the high-frequency circuit. When the high-frequency circuit is an amplifier circuit, substrate resonance causes a part of an output signal of the amplifier circuit to be input to an input terminal of the amplifier circuit and may induce unstable operations such as oscillation of the amplifier circuit.

A method of using a through-substrate via (NPL 1) is known as a method of suppressing substrate resonance. This is a technique of preventing leakage of electromagnetic wave to a substrate to suppress substrate resonance by densely forming a via that penetrates the substrate over the entire substrate to enable the entire substrate to be equivalently regarded as a metal.

However, at extremely high frequencies such as frequencies exceeding wo GHz, resonance of electromagnetic waves may occur not only in a high-frequency circuit board but also between a surface of a high-frequency circuit and a ceiling of a metallic chassis (in other words, an inner wall of the chassis which faces a surface of the high-frequency circuit). Such "intra-modular resonance" is generated due to several reasons, as will be described below.

Firstly, in frequency bands exceeding wo GHz, electromagnetic waves propagating through a high-frequency circuit are radiated from the high-frequency circuit and may become coupled to a mode of spatial propagation. This is attributable to the fact that, since high-frequency signals have short wavelengths at wo GHz and higher frequency bands, sizes of an input/output pad portion for a high-frequency signal, a wide transmission line, and the like become similar to the wavelength of the high-frequency signal, resulting in the transmission media starting to additionally acquire a function as an antenna.

In addition, secondly, a part of connection loss in a coaxial line that is an interface of the metallic chassis and in a connection portion between a waveguide and a high-frequency circuit also become coupled to a mode of spatial propagation.

When electromagnetic waves radiated into space due to the reasons given above propagate through a gap between a surface of a high-frequency circuit board and a ceiling of a chassis, the electromagnetic waves generate resonance at a specific frequency determined by a size of a metallic chassis or the like or causes a phenomenon in which input and output of an amplifier circuit are equivalently connected and may result in impairing intrinsic characteristics of a high-frequency circuit.

CITATION LIST

Non Patent Literature

[NPL 1] Hiroshi Hamada et al., "300-GHz band 20-Gbps ASK transmitter module based on InP-HEMT MMICs," IEEE Compound Semiconductor Integrated Circuit Symposium (CSICS), October 2015.

SUMMARY

Technical Problem

In consideration thereof, an object of embodiments of the present invention is to provide a high-frequency module capable of suppressing the intra-modular resonance described above and characteristic degradation of a high frequency circuit due to the intra-modular resonance.

Means for Solving the Problem

In order to achieve the object described above, a high-frequency module according to embodiments of the present invention includes: a chassis (20) which is made of a conductor and which has an internal space; a high-frequency circuit board (10) which is housed in the internal space of the chassis; and a resistive element (30) provided between an inner wall that opposes the high-frequency circuit board among inner walls of the chassis which define the internal space and the high-frequency circuit board.

The high-frequency module according to embodiments of the present invention may include a gap (40) between the high-frequency circuit board and the resistive element.

In this case, the high-frequency circuit board (10) may have a transmission line including conductive foils (11 and 12) formed on a surface that opposes the resistive element, and dimensions of the transmission line may satisfy a following formula when a design target value of loss of the transmission line is denoted by $\alpha$, a width of the transmission line is denoted by WT, resistivity of the resistive element is denoted by $\rho$, an electric field distribution on a surface perpendicular to a guiding direction of the transmission line is denoted by E (x, y), and a double integral is assumed to be represented by a corresponding area of the electric field distribution E (x, y) on a surface perpendicular to a guiding direction of the transmission line.

$$\frac{\rho \int\int_{\text{Resistive element}} |E|^2 \, dxdy}{\int\int_{\text{Entire area}} |E|^2 \, dxdy} < \alpha \qquad \text{Formula 1}$$

In this case, the transmission line may be a coplanar line which is formed on the surface of the high-frequency circuit board and which is made up of a first conductive foil (11) having a linear gap portion and a linear second conductive foil (12) formed at a center of the gap portion.

Effects of Embodiments of the Invention

According to embodiments of the present invention, since the resistive element (30) provided between an inner wall opposing a high-frequency circuit board of a chassis and the high-frequency circuit board acts as an electromagnetic wave absorber and suppresses electromagnetic waves propagating through a space between the high-frequency circuit board and the inner wall of the chassis which opposes the high-frequency circuit board, intra-modular resonance and characteristic degradation of a high-frequency circuit due to the intra-modular resonance can be suppressed.

DETAILED DESCRIPTION OF ILLUSTRATIVE EMBODIMENTS

Figure 1:
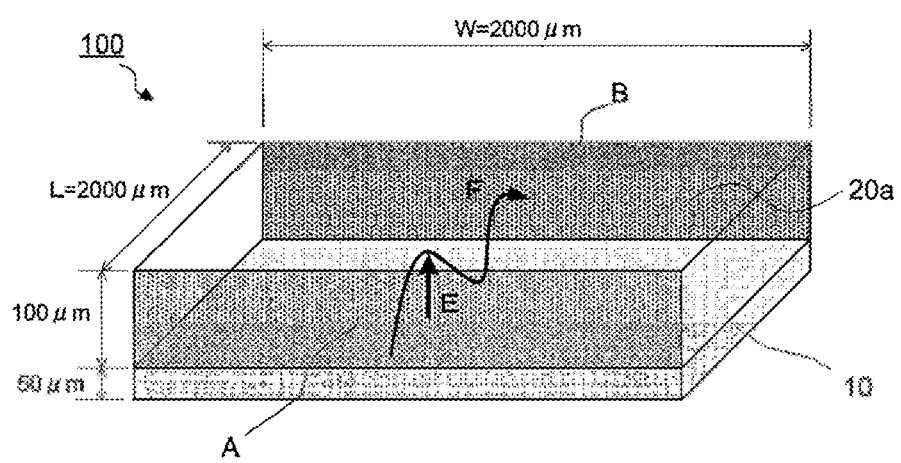
FIG. 1 is a diagram for illustrating intra-modular resonance.

Hereinafter, a principle of embodiments of the present invention and an embodiment of the present invention will be described with reference to the drawings.
[Principle of Present Invention]
First, a principle of embodiments of the present invention will be described with reference to FIGS. 1 to 3.
FIG. 1 shows a computation model of a high-frequency module (hereinafter, may be simply referred to as a "module") 100 in which a substrate (a high-frequency integrated circuit board: hereinafter, may be simply referred to as a "high-frequency circuit board") 10 on which a high-frequency circuit is formed is mounted to a metallic chassis. In FIG. 1, the high-frequency circuit board 10 and an internal space of the metallic chassis are illustrated but the chassis itself is omitted.
In the computation model shown in FIG. 1, a length and a width of the high-frequency circuit board 10 are respectively set to 2000 lam and a thickness thereof is set to 50 μm. On the assumption that the high-frequency circuit board 10 is made of InP, dielectric constant of the high-frequency circuit board 10 is set to 12.3. In addition, a gap between an upper surface of the high-frequency circuit board 10 and a ceiling 20a of the module is set to 100 μm. Furthermore, it is assumed that the high-frequency circuit board 10 and module wall surfaces are in contact with each other in a gapless manner with the exception of a ceiling portion.

Moreover, in the computation model shown in FIG. 1, it is assumed that the upper surface (a surface on which the high-frequency circuit is formed) of the high-frequency circuit board 10 is entirely covered by metal for the sake of brevity. This assumption is based on frequently-used configurations in high-frequency circuits such as using a coplanar line (CPW) including a ground metal on an upper surface of a substrate and using a thin-film microstrip line (TFMS) which uses a part of multilayer wiring formed on an upper surface of a substrate as a ground metal. A coplanar line and a thin-film microstrip line are transmission paths that are often used in high-frequency integrated circuits, and since such transmission paths assume that a large portion of the upper surface of the substrate is occupied by a ground metal, the assumption described above is valid. In addition, the metal used in this calculation is assumed to be an ideal conductor with infinite conductivity.

Using the computation model described above, as shown in FIG. 1, signal ports A and B were respectively set on a pair of mutually opposing walls of the module 100 and passage characteristics (S21) from the port A to the port B were calculated. S21 having a large value means that there is a mode in which the electromagnetic wave propagates through a gap in the module.

Since the gap inside the module is enclosed by metal, the gap acts as a waveguide with respect to high-frequency signals. Therefore, the TER) mode which enables propagation from a lowest frequency in the case of a waveguide becomes a primary propagation mode of intra-modular resonance. As shown in FIG. 1, the TE01 mode is a mode in which electrolysis occurs in a direction perpendicular to a surface of the high-frequency circuit board 10.

Figure 2:
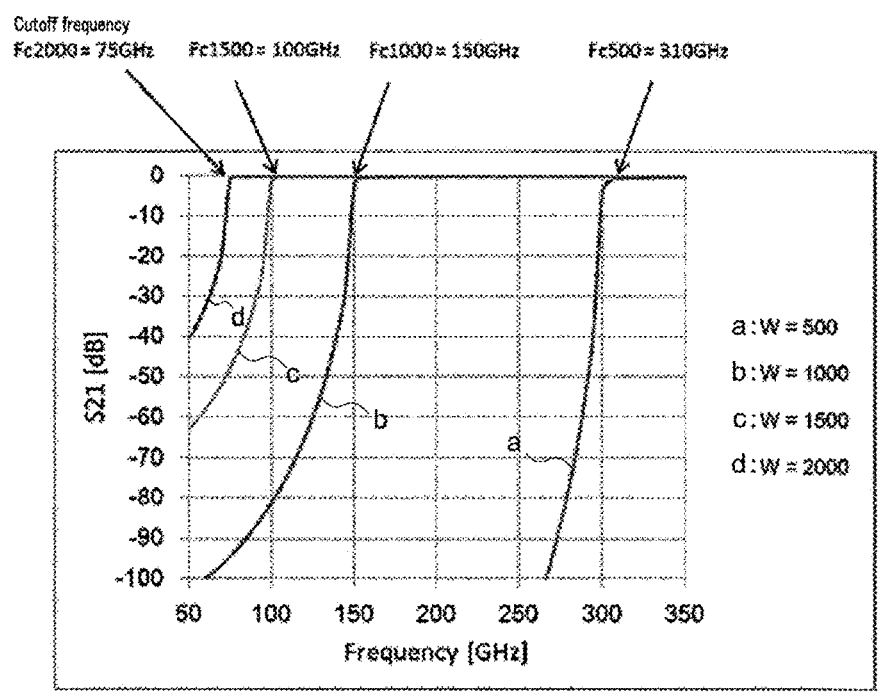
FIG. 2 is a diagram showing a relationship between a width of an internal space of a chassis and propagation of a TE10 mode in a module.

FIG. 2 shows S21 of the TE10 mode as calculated in the computation model shown in FIG. 1. In this case, S21 was respectively calculated with respect to a width W of the high-frequency circuit board 10 of 500 μm, 1000 μm, 1500 μm, and 2000 μm.

According to FIG. 2, with respect to each width W, it is shown that a propagation starts with the condition that S21 is 0 dB or, in other words, a passage loss is 0 at a cutoff frequency or higher. This property is similar to that of the TE10 mode of propagation through a general waveguide and reveals that the gap acts equivalently to a waveguide as described above. In addition, it is revealed that a width of the module (in this model, a same value as a substrate width) increases and cutoff frequency declines, thereby causing intra-modular resonance to be generated even at lower frequencies. FIG. 2 also reveals that, in order to reduce S21 and avoid intra-modular resonance, reducing the width of the gap of the module is effective.

Figure 3:
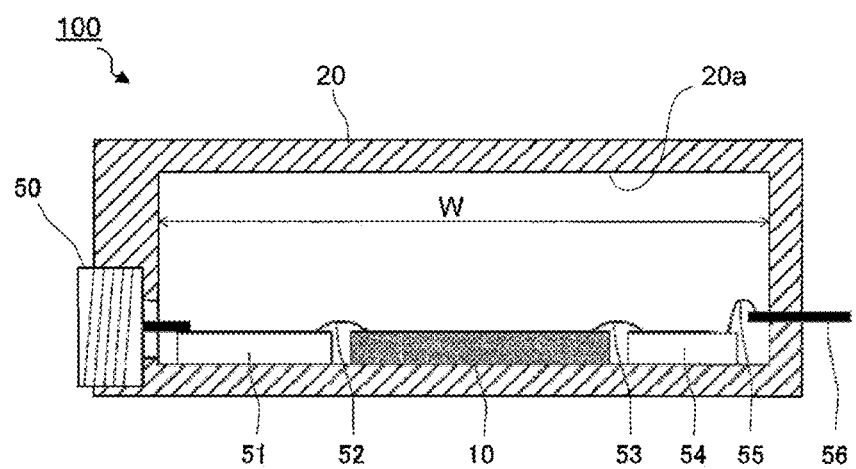
FIG. 3 is a conceptual diagram illustrating a configuration example of a high-frequency module.

However, generally, since a chip width of a high-frequency circuit board is 1 mm or more and, as shown in FIG. 3, space for arranging an interior substrate 51, peripheral parts 54 such as a DC substrate and a chip capacitor, and wires 52, 53, and 54 for connecting such parts is required around the high-frequency circuit board 10, even though the chip width of the high-frequency circuit board 10 is 1 mm, a width of the gap surrounding the high-frequency circuit board 10 is inevitably larger than 1 mm. Therefore, there is a limit to a method of reducing a gap width of the module and cutting off the TE10 mode. In particular, FIG. 2 reveals that cutting off the TE10 mode at a frequency band of 300 GHz or higher requires setting an extremely small gap width of 500 μm or smaller and, considering the fact that a chip width of an actual high-frequency circuit is 1 mm or more, it is infeasible to cut off the TE10 mode at a frequency band of 300 GHz.

In consideration thereof, in embodiments of the present invention, propagation of the TE10 mode is suppressed by inflicting a loss to the TE10 mode instead of cutting off the TE10 mode.

Embodiment

Figure 4:
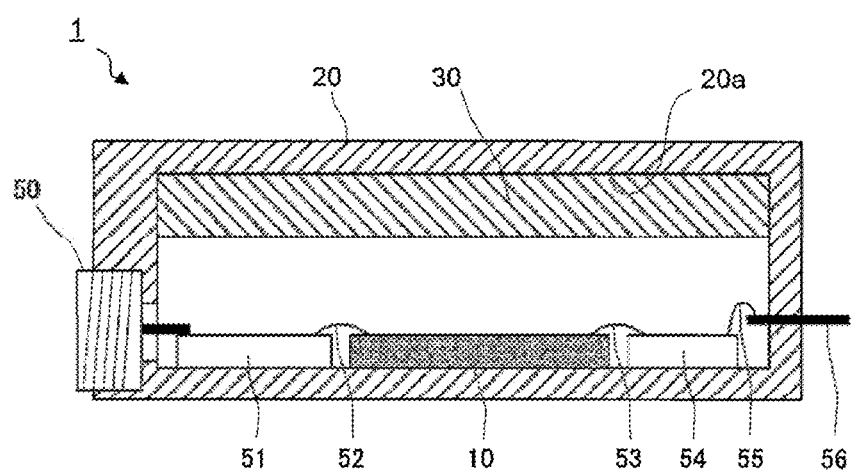
FIG. 4 is a conceptual diagram showing a configuration example of a high-frequency module according to an embodiment of the present invention.

FIG. 4 shows a configuration example of a high-frequency module according to an embodiment of the present invention.

A high-frequency module 1 according to the present embodiment is a high-frequency module including: a chassis 20 which is made of a conductor and which has an internal space; and a high-frequency circuit board 10 which is housed in the internal space of the chassis 20, wherein a resistive element 30 is provided between an inner wall that opposes the high-frequency circuit board 10 among inner walls of the chassis 20 which define the internal space and the high-frequency circuit board 10.

In this case, the high-frequency circuit board 10 is made of a semiconductor material such as InP, and a conductive foil such as gold is provided on top of or inside the substrate to form a transmission path.

In addition, the chassis 20 is made of a metal such as copper or aluminum or, in other words, a conductor, and forms an internal space of an approximately legislative body. Besides the high-frequency circuit board 10, an interior substrate 51 and peripheral parts 54 such as a DC substrate and a chip capacitor are arranged in the internal space of the chassis 20 and are connected to each other by wires 52 and 53. Furthermore, a mounting port of a coaxial connector 50 and a DC terminal 56 are provided on a side wall of the chassis 20. The coaxial connector 50 and the DC terminal 56 are respectively connected to the interior substrate 51 and the peripheral parts 54 either directly or by a wire 54.

In addition, the resistive element 30 is a plate-shaped member made of an electromagnetic wave absorber. For example, a conductive Si substrate can be used as the resistive element 30.

The resistive element 30 is provided separated from the high-frequency circuit board 10 in the internal space of the chassis 20. While the resistive element 30 may be arranged between the high-frequency circuit board 10 and an inner wall of the chassis 20 which opposes the high-frequency circuit board 10, in the present embodiment, the resistive element 30 is loaded to a ceiling of a gap portion of the module 1 or, in other words, an inner wall surface of the chassis 20 which opposes the high-frequency circuit board 10.

Since a ceiling (an inner wall surface) 20a which opposes the high-frequency circuit board 10 in the internal space of the chassis 20 is made of metal, the ceiling 20a has a same potential. Even when the resistive element 30 is arranged on a surface with the same potential, generally, the resistive element 30 cannot inflict a loss to a signal propagating through the surface. However, in a case where a propagating signal is the TE10 mode, since an orientation of an electric field is perpendicular to the ceiling (refer to FIG. 1), when the resistive element 30 has finite thickness, a difference in potential is created between a surface in contact with the ceiling 20a and a surface opposing the high-frequency circuit board 10 of the resistive element and a Joule loss can be imparted to the TE10 mode. As a result, the TE10 mode that propagates through the gap can be attenuated and intra-modular resonance can be suppressed.

By providing the resistive element 30 in this manner, a propagation loss can be imparted to the TE10 mode that propagates through the gap inside the chassis 20 and intra-modular resonance can be suppressed.

Next, as the module 1 according to the present embodiment, a simulation on the assumption that the resistive element 30 is arranged on a ceiling of a 300 GHz-band module will be described.

Figure 5:
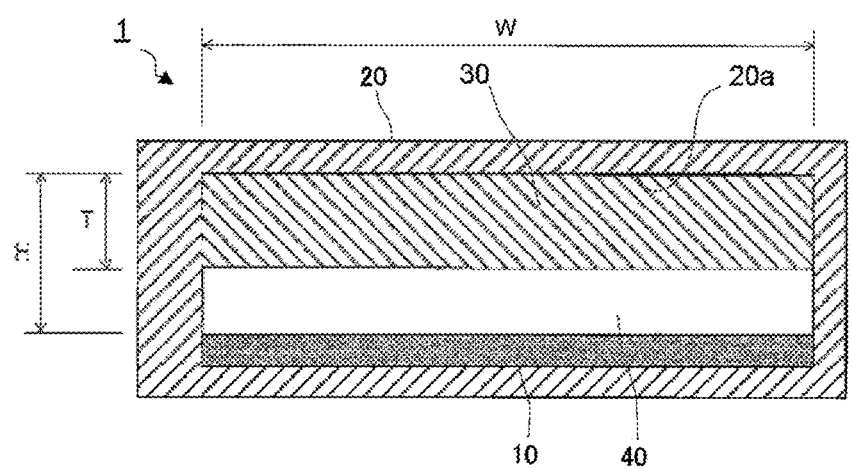
FIG. 5 is a diagram showing a configuration example of a high-frequency module according to the present embodiment.
Figure 6:
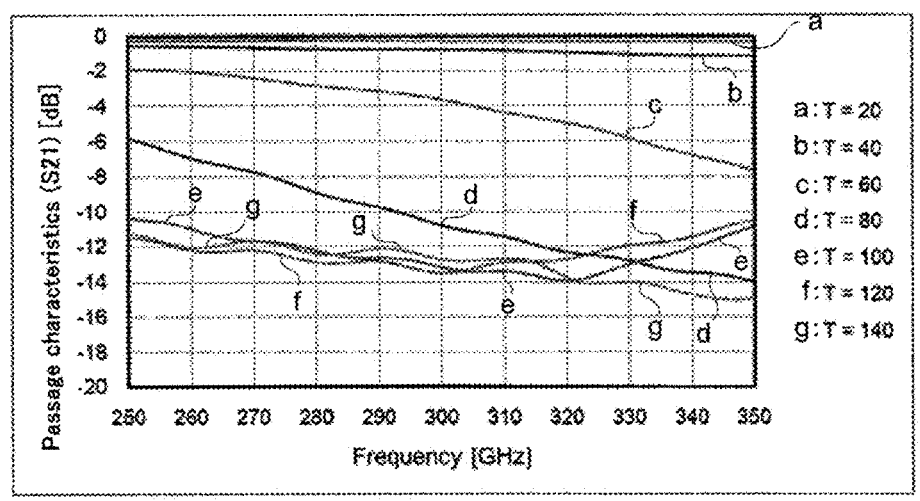
FIG. 6 is a diagram showing a relationship between thickness of a resistive element and attenuation of a TE10 mode that propagates inside a chassis.

FIG. 5 is a diagram for illustrating a computation model and FIG. 6 is a diagram showing a simulation result.

As shown in FIG. 5, in the computation model used in the simulation, InP was used as the material of the high-frequency circuit board 10 and dielectric constant thereof was set to 12.3 in a similar manner to the computation model shown in FIG. 1. In addition, for the sake of brevity, it was assumed that an upper surface of the high-frequency circuit board 10 is covered by an ideal conductor. Furthermore, a distance between the high-frequency circuit board 10 and the ceiling 20a of the chassis 20 was set to 150 μm and a width of the gap was set to 2000 μm. Assuming that a conductive Si substrate is to be used as the resistive element 30, resistivity was set to 0.01 Ωcm, dielectric constant was set to 11.9, and a thickness T μm was adopted as a parameter.

In a similar manner to FIG. 1, signal ports A and B were respectively set on a pair of mutually opposing surfaces of the high-frequency module 1 and passage characteristics (S21) from the port A to the port B were calculated to calculate attenuation of the TE10 mode.

FIG. 6 shows calculation results thereof. The results indicate that, by setting the thickness of the resistive element 30 to 100 μm or more, attenuation of the TE10 mode can be made 10 dB or more in a frequency band from 250 GHz to 350 GHz. Since intra-modular resonance is conceivably caused by the TE10 mode being reflected by the inner wall of the module and causing a standing wave, it is shown that setting the thickness T of the resistive element 30 to 100 μm or more results in a round-trip attenuation of 20 dB or more until the TE10 mode is reflected once by the inner wall.

In embodiments of the present invention, it is important that the resistive element added to the wall surface of the ceiling 20a of the chassis 20 be designed not to adversely affect the high-frequency circuit. In other words, as an adverse effect to the high-frequency circuit, an adverse effect of an increase in propagation loss of the transmission line formed inside the high-frequency circuit due to a wave absorbing effect of the resistive element 30 is supposed. In particular, as shown in FIG. 7, when using a coplanar line made up of a first conductive foil 11 having a linear gap portion formed on a surface of the high-frequency circuit board 10 and a linear second conductive foil 12 formed at center of the gap portion as a transmission line, since seepage of the electric field onto the upper surface of the high-frequency circuit board 10 is large, it is supposed that the coplanar line is susceptible to the effect of the resistive element 30.

Figure 7:
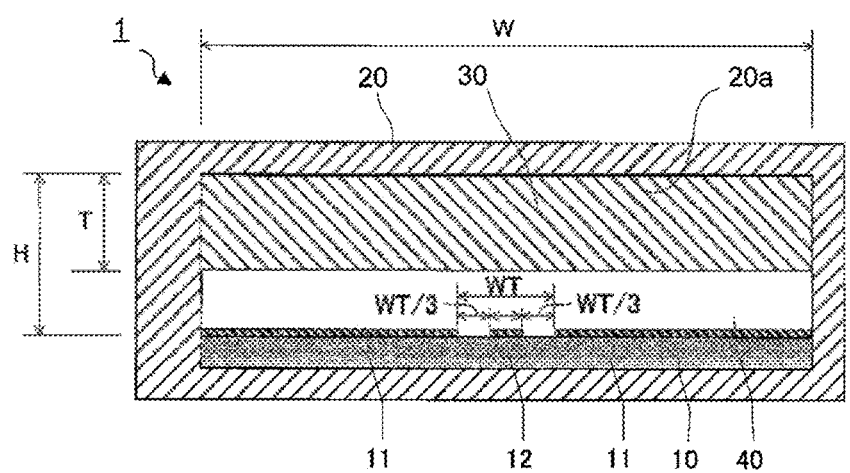
FIG. 7 is a diagram illustrating a case where a coplanar line is arranged on a high-frequency circuit board in the high-frequency module according to the present embodiment.

In order to quantitatively evaluate this effect, a propagation loss of a coplanar line was calculated using the computation model shown in FIG. 7. The computation model shown in FIG. 7 is the same as the computation model shown in FIG. 5 in terms of dimensions and physical property values of the high-frequency circuit board 10, the chassis 20, and the resistive element 30. In the computation model shown in FIG. 7, a coplanar line with a total width (a value that is a sum of a line width of the second conductive foil 12 and a gap width between the second conductive foil and the first conductive foil to be ground) WT was formed on the high-frequency circuit board 10, and propagation loss [dB/mm] at 300 GHz when varying the total width WT was calculated by electromagnetic field analysis. In this case, it was assumed that the coplanar line is made of an ideal metal with a metal thickness of 1 μm. In addition, both the line width of the coplanar line and the gap width were set to WT/3.

Figure 8:
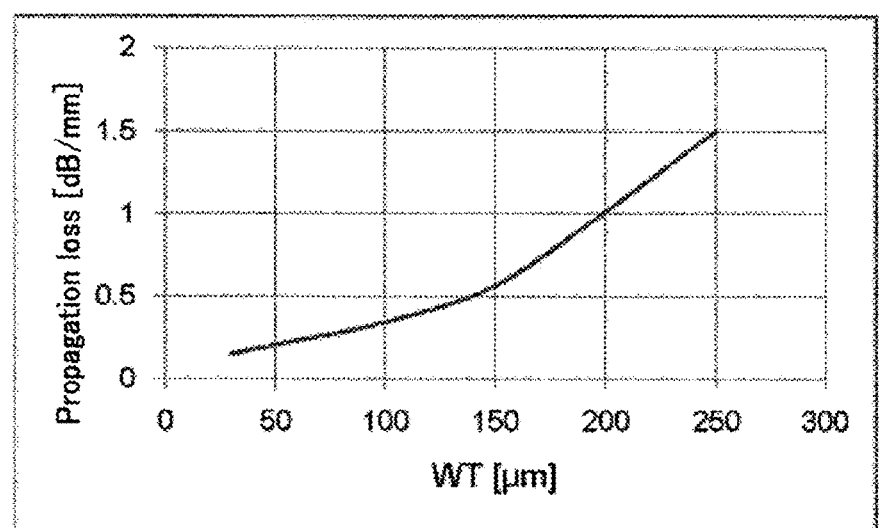
FIG. 8 is a diagram showing coplanar line propagation loss at 300 GHz and a total width of a coplanar line.

FIG. 8 shows a calculation result of a propagation loss of a coplanar line using the computation model shown in FIG. 7.

FIG. 8 reveals that propagation loss exceeds 1 dB/mm when the total width of the coplanar line exceeds 200 μm.

Generally, with a coplanar line, the larger the total width, the smaller the propagation loss. This is because an increase in signal line width causes conductor loss per unit length to decrease. However, the result shown in FIG. 8 conversely demonstrates that the larger the total width, the larger the transmission loss. This is conceivably due to the fact that, when the total width increases, as shown in FIG. 9, "electric field seepage" $E_{ABS}$ in which a part of an electric field E which is radiated to the upper surface of the substrate 10 increases and a proportion of propagation through the resistive element on the substrate upper surface of a mode propagating through the coplanar line increases.

Therefore, instead of simply arranging the resistive element 30 on the ceiling (inner wall surface) 20a that opposes the high-frequency circuit board 10, it is important that the high-frequency circuit of the high-frequency circuit board 10 also be designed such that the arranged resistive element 30 does not affect the high-frequency circuit. Since performing an electromagnetic field analysis and studying loss as shown in FIG. 8 after circuit design can be a hassle, design for determining a maximum value of a usable total width in advance is extremely important. Such design will be described below.

Figure 9:
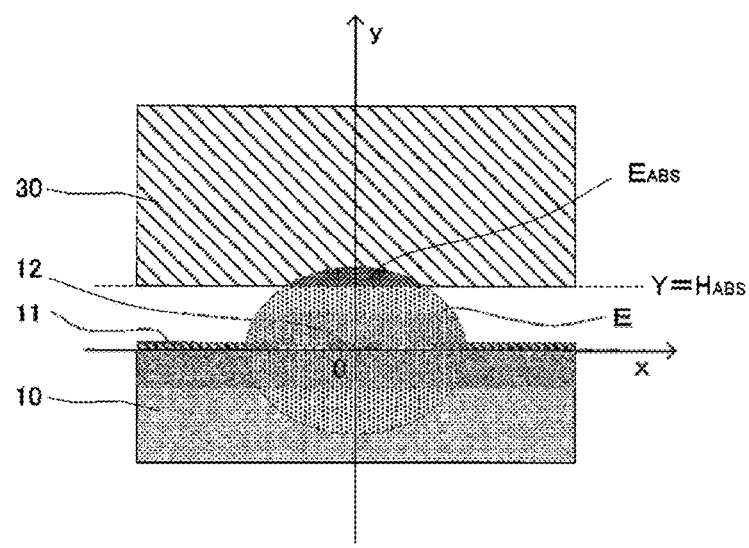
FIG. 9 is a diagram showing an electric field distribution of the coplanar line.

As described above, propagation loss is generated by electric field seepage $E_{ABS}$ to the resistive element 30 positioned above the high-frequency circuit board 10 (refer to FIG. 9). In consideration thereof, propagation loss can be calculated by an amount of electric field seepage to an entire electric field distribution. Let us assume that resistivity of a resistive element is ρ [Ωmm]. As represented by Formula (i) below, propagation loss is a ratio of an electric field that is absorbed by the resistive element 30 or, in other words, a value obtained by multiplying an amount of seepage $E_{ABS}$ to the resistive element 30 by resistivity ρ to an entire electric field distribution E.

[Formula 2]

$$\text{Propagation loss} = \frac{\rho \iint_{Resistive\ element} |E|^2\, dxdy}{\iint_{Entire\ area} |E|^2\, dxdy} \quad (1)$$

In Formula (i), the double integral of the denominator represents a sum of energy of modes over an entire calculation area of a coplanar line cross section shown in FIG. 9, and the double integral of the numerator represents energy of a mode that propagates through a portion ($E_{ABS}$) of the coplanar line cross section shown in FIG. 9 which intersects the resistive element.

In this case, since the electric field distribution E varies when the total width WT of the coplanar line is varied, the electric field distribution E can be represented as a function E (WT) of the total width WT. Therefore, as shown in FIG. 9, when a distance from the high-frequency circuit board 10 to the resistive element 30 is denoted by HABS, the total width WT of the coplanar line may be determined in advance so as to satisfy Formula (2) below in order to realize a design that keeps propagation loss to or below α [dB/m].

Formula 3

$$\frac{\rho \iint_{y>H_{ABS}} |E(W_T)^2|\, dxdy}{\iint |E(W_T)^2|\, dxdy} < \alpha \quad (2)$$

As described above, since electric field seepage $E_{ABS}$ to the resistive element 30 increases when the total width WT of the coplanar line is increased, a left side of Formula (2) is a monotonically increasing function of the total width WT. Therefore, the total width WT satisfying Formula (2) has an upper limit WTu. Since Formula (2) is a two-dimensional calculation, a three-dimensional calculation such as that used in the calculation of FIG. 8 is not required and the calculation can be performed in a short amount of time.

In consideration thereof, as shown in FIG. 6, a required thickness of the resistive element 30 may be calculated in advance from a relationship between passage characteristics (S21) and the thickness of the resistive element 30 and, at the thickness, the left side of Formula (2) may be calculated with the total width WT as a parameter to determine the upper limit WTu of the total width WT satisfying Formula (2).

When designing a high-frequency circuit, designing using a coplanar line within a range that does not exceed the upper limit WTu of the total width WT determined in this manner enables design that reduces the effect of a resistive element to be implemented. In particular, with a circuit in which loss of an output stage must be reduced in order to increase output power such as a power amplifier, since a wide coplanar line is often used in order to reduce loss of the output power, the circuit is readily affected by a resistive element. In order to perform low-loss design of the output stage, knowing the upper limit WTu of the total width WT in a circuit design stage enables more accurate power amplifier design that suppresses an effect of a resistive element to be performed.

It is needless to say that the discussion described above can be applied in an exactly same manner to cases where a microstrip line is used instead of a coplanar line.

INDUSTRIAL APPLICABILITY

The present invention can be utilized in a high-frequency module using a high-frequency electric signal.

REFERENCE SIGNS LIST 1, 100 High-frequency module (module)
10 High-frequency circuit board
11 First conductive foil
12 Second conductive foil 20 Chassis
20a Ceiling
30 Resistive element
40 Gap
50 Coaxial connector
51 Interior substrate
52, 53, 55 Wire
54 Peripheral pall
56 DC terminal

The invention claimed is:

1. A high-frequency module, comprising:
a chassis made of a conductor, wherein the chassis has an internal space;
a high-frequency integrated circuit board housed in the internal space of the chassis; and
a resistive element between an inner wall of the chassis and the high-frequency integrated circuit board, wherein the inner wall faces a top surface of the high-frequency integrated circuit board;
wherein the high-frequency integrated circuit board comprises a transmission line, the transmission line comprise conductive foils on the top surface of the high-frequency integrated circuit board; and
wherein dimensions of the transmission line satisfies:

$$\frac{\rho \iint_{Resistive\ element} |E|^2\ dxdy}{\iint_{Entire\ area} |E|^2\ dxdy} < \alpha,$$

wherein a design target value of loss of the transmission line is denoted by $\alpha$, a resistivity of the resistive element is denoted by $\rho$, an electric field distribution on a surface perpendicular to a guiding direction of the transmission line is denoted by $E\ (x, y)$, and a double integral represents a corresponding area of the electric field distribution $E\ (x, y)$ on a surface perpendicular to a guiding direction of the transmission line.

2. The high-frequency module according to claim 1 further comprising a gap between the high-frequency integrated circuit board and the resistive element.

3. The high-frequency module according to claim 2, wherein the transmission line is level on the top surface of the high-frequency integrated circuit board, and wherein the transmission line comprises:
a first conductive foil having a linear gap disposed therein; and
a linear second conductive foil at a center of the linear gap.

4. The high-frequency module according to claim 1, wherein the resistive element comprises a conductive semiconductor material.

5. A method, comprising:
providing a conductive chassis, wherein the conductive chassis has an internal space;
placing a high-frequency integrated circuit board in the internal space of the conductive chassis; and
disposing a resistive element between an inner wall of the conductive chassis and the high-frequency integrated circuit board, wherein the inner wall faces a top surface of the high-frequency integrated circuit board;
wherein the high-frequency integrated circuit board comprises a transmission line, the transmission line comprise conductive foils on the top surface of the high-frequency integrated circuit board; and
wherein dimensions of the transmission line satisfies:

$$\frac{\rho \iint_{Resistive\ element} |E|^2\ dxdy}{\iint_{Entire\ area} |E|^2\ dxdy} < \alpha,$$

wherein a design target value of loss of the transmission line is denoted by $\alpha$, a resistivity of the resistive element is denoted by $\rho$, an electric field distribution on a surface perpendicular to a guiding direction of the transmission line is denoted by $E\ (x, y)$, and a double integral represents a corresponding area of the electric field distribution $E\ (x, y)$ on a surface perpendicular to a guiding direction of the transmission line.

6. The method according to claim 5, wherein a gap is disposed between the high-frequency integrated circuit board and the resistive element.

7. The method according to claim 5, wherein the transmission line is level on the top surface of the high-frequency integrated circuit board, and wherein the transmission line comprises:
a first conductive foil having a linear gap disposed therein; and
a linear second conductive foil at a center of the linear gap.

8. The method according to claim 5, wherein the resistive element comprises a conductive semiconductor material.

* * * * *